US006919767B2

(12) United States Patent
Mechnig et al.

(10) Patent No.: US 6,919,767 B2
(45) Date of Patent: Jul. 19, 2005

(54) CIRCUIT ARRANGEMENT FOR LOW-NOISE FULLY DIFFERENTIAL AMPLIFICATION

(75) Inventors: Stephan Mechnig, Munich (DE);
Markus Schimper, Moosinning (DE);
Ralf Schledz, Zolling (DE)

(73) Assignee: Infineon Technologies AG, Munich (DE)

(*) Notice: Subject to any disclaimer, the term of this patent is extended or adjusted under 35 U.S.C. 154(b) by 42 days.

(21) Appl. No.: 10/450,916

(22) PCT Filed: Dec. 5, 2001

(86) PCT No.: PCT/EP01/14288

§ 371 (c)(1),
(2), (4) Date: Oct. 27, 2003

(87) PCT Pub. No.: WO02/052720

PCT Pub. Date: Jul. 4, 2002

(65) Prior Publication Data

US 2004/0046593 A1 Mar. 11, 2004

(30) Foreign Application Priority Data

Dec. 22, 2000 (DE) ......................................... 100 64 207

(51) Int. Cl.$^7$ ................................................. H03F 3/45
(52) U.S. Cl. ........................ 330/253; 330/257; 330/260
(58) Field of Search ................................. 330/253, 257, 330/260

(56) References Cited

U.S. PATENT DOCUMENTS

| | | | |
|---|---|---|---|
| 4,742,308 A | | 5/1988 | Banu |
| 5,420,539 A | | 5/1995 | Fensch |
| 5,455,539 A | | 10/1995 | Mazoyer et al. |
| 6,037,838 A | * | 3/2000 | Marchese et al. ........... 330/254 |
| 6,480,128 B1 | * | 11/2002 | Bach et al. .................. 341/122 |
| 6,753,732 B1 | * | 6/2004 | Moreland ................... 330/261 |

FOREIGN PATENT DOCUMENTS

EP 0 641 069 3/1995

OTHER PUBLICATIONS

Banu, Mihai et al., "Fully Differential Operational Amplifiers with Accurate Output Balancing", *IEEE Journal of Solid–State Circuits*, vol. 23, No. 6, pp. 1410–1414; 1998.

Claessen, von Ulrich et al., "Erhöhte Genauigkeit bei der Simulation analoger CMOS–Schaltungen durch ein verbessertes MOS–Kompaktmodell", *Archiv fur Elktronik und Ubertragungstechnik*, vol. 44, No. 2, pp. 139–147; 1990.

Luh, Louis et al., "A Continuous–Time Common–Mode Feedback Circuit (CMFB) for High–Impedance Current–Mode Applications", *IEEE Transactions on Circuits and Systems*, vol. 47, No. 4, pp. 363–369; 2000.

Xu, Gonggui and Embabi, H.K., "A Systematic Approach in Constructing Fully Differential Amplifiers", *IEEE Transactions on Circuits and Systems*, vol. 47, No. 11, pp. 1343–1347; 2000.

* cited by examiner

Primary Examiner—Patricia Nguyen
(74) Attorney, Agent, or Firm—Fish & Richardson P.C.

(57) ABSTRACT

The invention relates to a circuit for low noise, fully differential amplification. A feedback signal (121) is detected in a differential output step of the differential amplification circuit by means of a voltage distributor formed by a first feedback resistance (119) and a second feedback resistance (120). A first output signal (111) is provided at a first output circuit node (117) and a second output signal (112) is provided at a second output circuit node (118). The respective first and second output signals (111) or (112) form a full output signal which corresponds to an input signal formed by a first and a second input signal (101) or (102). A load current (134), an input current (132) and a reference current (132) are established by means of a load current source (128), an input current source (131) and a reference current source (127). A matching transistor (301) is used to adjust an adaptation between the load current source (128), the input current source (131) and the reference current source (127). A feedback signal (121) of the differential amplification circuit is compared with a reference voltage (122) in a reference step, and the load current (134) is mirrored in the differential input step, in a current mirror device.

25 Claims, 5 Drawing Sheets

CIRCUIT ARRANGEMENT FOR LOW-NOISE FULLY DIFFERENTIAL AMPLIFICATION

FIELD OF INVENTION

The present invention relates to a circuit arrangement for low-noise amplification, and relates in particular to a low-noise, fully differential amplifier.

BACKGROUND

Fully differential amplifiers are used in many areas involving the amplification of differential signals over a wide operating frequency range. In particular but not exclusively—these fully differential amplifiers are used to amplify extremely small input signals into output signals that are as free as possible from noise. Fully differential amplifiers generally require a common-mode control for setting a common-mode voltage at the amplifier output. Said common-mode control must satisfy one or both of the following requirements:

(a) a sufficient gain bandwidth of the overall circuit arrangement must be ensured; and (b) any noise of the overall circuit arrangement must not exceed predetermined limits.

In this case, it should be noted that the boundary condition specified under (b) encompasses 1/f noise, in particular. The two requirements ((a)(b)) mentioned above conflict with one another since a low 1/f noise imposes significant demands on the circuit elements for amplifying the signals. In other words, there is a general requirement for field-effect transistors having a very large gate area, which in turn limit the bandwidth of the common-mode control loop. On the other hand, if transistors having a small gate area are used, then the 1/f noise of the amplifier is increased.

If the gain bandwidth becomes too small, effects such as nonlinearities in the amplifier behavior and a distortion of input signals occur to a notable extent.

Analog circuit arrangements for the differential amplification of input signals are specified according to the prior art. "Analog Integrated Circuit Design" by David Johns, Ken Martin, pages 290–291, discloses a circuit arrangement which encompasses a common-mode control, the common-mode voltage at the amplifier output, minus a DC voltage level for a shift, being generated at a feedback node $V_A$.

This voltage is then compared with a reference voltage $V_{ref}$ using an additional amplifier. Although this approach functions, it has considerable restrictions. These restrictions consist in the fact that the voltage drop across source follower transistors limits the differential signals which can be processed. This limiting has a disadvantageous effect particularly when low supply voltages are used. In addition, the further nodes in the common-mode control loop have the effect that the entire circuit arrangement is more difficult to compensate.

An important consideration in the design of common-mode control circuits is that they have to be compensated. Otherwise, the circuits can become unstable.

A further circuit arrangement for fully differential amplification by means of operational amplifiers with precise output balancing is disclosed in IEEE Journal of Solid State Circuits (1988), Volume 23, No. 6, pages 1410–1414. An operational amplifier with a balanced output is a special case of the known amplifier with a differential output. Amplifiers with a differential output usually contain the common-mode control circuit mentioned. In this case, however, the outputs of specific circuit designs are not balanced.

A further circuit arrangement for common-mode control is disclosed for high-impedance current-mode applications in IEEE Transactions on Circuits and Systems II: "Analog and Digital Processing (2000)" Volume 47, No. 4, pages 363–359, under the title "A continuous-time common-mode feedback circuit (CMFB) for high-impedance current-mode applications" by Lah, L.; Choma, J., Jr. and Draper, J. In this case, a common-mode control stabilizes the common-mode signal.

A main disadvantage of the circuit arrangements according to the prior art is that stability problems occur on account of the introduction of a pole into the common-mode control loop. The occurrence of a pole is unavoidable, in principle, according to the circuit arrangements in the prior art. In the case of a circuit topology according to the prior art, a stabilization of the common-mode control can only be stabilized if the gain bandwidth is shifted toward low frequencies by corresponding circuit measures, so that a pole which occurs in conventional circuit arrangements becomes a dominant pole.

In circuit arrangements according to the prior art, the pole is usually at low frequencies owing to large differential amplifier transistors, so that the differential amplifier circuit arrangement has to be subjected to a high degree of frequency compensation, which in turns leads to a further reduction of the bandwidth. The consequence of this is that the gain decreases on account of the low bandwidth as the frequency increases, thereby bringing about a distortion of the input signals to be amplified.

Consequently, a further disadvantage of conventional circuit arrangements with differential amplifiers is that only a small gain bandwidth can be achieved.

Figure 5:
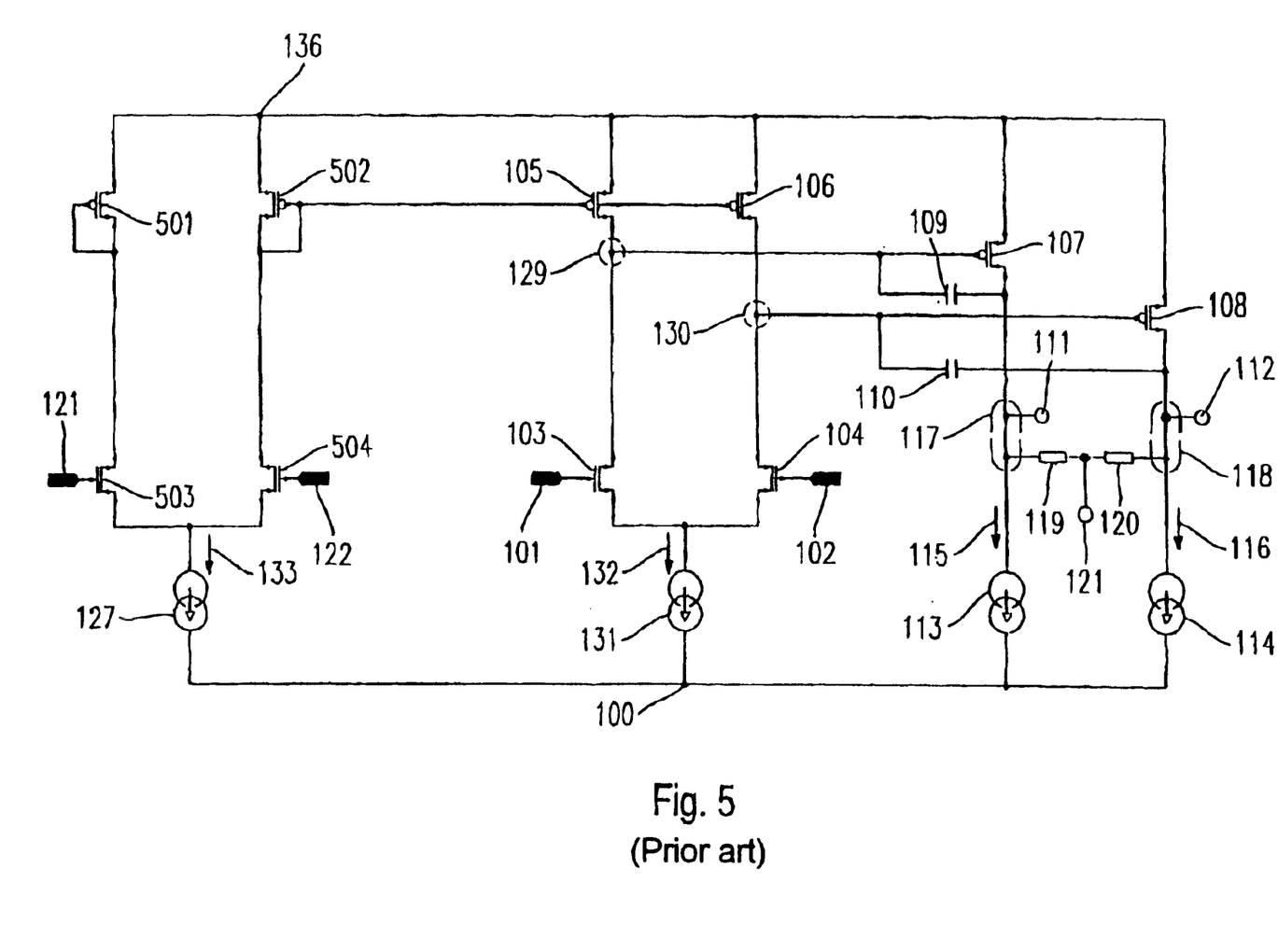
FIG. 5 shows a circuit arrangement for the differential amplification of a differential input signal into a corresponding differential output signal according to the prior art.

FIG. 5 shows a circuit arrangement for the differential amplification of a differential input signal into a corresponding differential output signal according to the prior art.

As shown in FIG. 5, a common-mode voltage is determined by means of a voltage divider between the two outputs of a differential output stage of the circuit arrangement. The common-mode reference voltage is compared with a reference voltage in a reference stage formed with two reference transistors and with two reference loads. In this case, the reference transistors are formed as a first reference differential transistor and a second reference differential transistor.

In differential amplifiers limited by a 1/f noise, this common-mode control can be used only when the common-mode control either has a low DC voltage gain or is very slow. The transistors used for this common-mode control have a large area, which means that they have a large gate area, as a result of which the 1/f noise is reduced. The current mirror thus formed has the effect of introducing into the common-mode control loop an additional pole which leads to the circuitry disadvantage that stability problems occur in the common-mode control.

SUMMARY

Consequently, it is a main object of the present invention to provide a common-mode control for a differential amplifier, the differential amplifier being intended to have a large gain bandwidth.

A further object of the present invention is to limit the 1/f noise.

Yet another object of the present invention is to prevent a distortion of input signals which is brought about as a result of an excessively small gain bandwidth.

The apparatus according to the invention and the method according to the invention have the main advantage that a common-mode control is provided for a low-noise, fully differential amplifier, a large bandwidth being maintained without increasing the 1/f noise.

A further advantage of the present invention consists in the provision of a common-mode control which does not generate an additional pole.

Yet another advantage of the present invention consists in the provision of a common-mode control in which only a partial current is controlled.

Yet another advantage of the present invention consists in the provision of a start circuit unit which enables starting and setting of a suitable operating point.

The heart of the invention is a circuit arrangement for fully differential amplification with a low 1/f noise and a common-mode control in which only a partial current is controlled.

In accordance with one preferred development of the present invention, a matching transistor is provided, which ensures that matching between the current sources used is achieved.

In accordance with a further preferred development of the present invention, a start circuit unit, comprising a first start transistor and a second start transistor, is provided in order to enable starting of the overall circuit arrangement.

In accordance with yet another preferred development of the present invention, a first input transistor and a second input transistor form an input circuit with a differential input stage.

In accordance with yet another preferred development of the present invention, a first output transistor and a second output transistor form an amplifier with a differential output stage.

In accordance with yet another preferred development of the present invention, for a common-mode control, a common-mode voltage is determined as a feedback signal by means of a voltage divider arranged between a first output circuit node, to which a first output signal is applied, and a second output circuit node, to which a second output signal is applied.

In accordance with yet another preferred development of the present invention, the feedback signal is compared with a reference voltage.

In accordance with yet another preferred development of the present invention, a common-mode voltage can be tapped off at the output stage between drain terminals of the first and second output transistors.

In accordance with yet another preferred development of the present invention, a common-mode control is provided in which a reference current which is only a part of the load current provided by a load current source is used for the control.

In accordance with yet another preferred development of the present invention, a common-mode control is provided in which a partial current is set in accordance with a divisor factor k which is less than one.

In accordance with yet another preferred development of the present invention, the load transistor formed as a diode load is operated with a load current, which is mirrored via the first and second current mirror transistors in each case into the differential input stage which is formed from a first input transistor and a second input transistor.

In accordance with yet another preferred development of the present invention, first and second start transistors which are respectively connected in parallel with the first and second input transistors are provided in the differential input stage.

In accordance with yet another preferred development of the present invention, the common-mode control acts in each case at first and second reference circuit nodes with a respective partial current which is controlled by first, second and third reference transistors.

In accordance with yet another preferred development of the present invention, second and third reference transistors are provided which have a transconductance less than that of the first and second input transistors.

In accordance with yet another preferred development of the present invention, a common-mode control which avoids an additional pole is provided.

In accordance with yet another preferred development of the present invention, a load current source which drives a load current is provided.

In accordance with yet another preferred development of the present invention, a matching transistor is provided, to whose gate terminal a reference voltage is applied and whose drain-source path transmits the load current.

In accordance with yet another preferred development of the present invention, a first reference load of a first reference transistor is formed by a resistor.

In accordance with yet another preferred development of the present invention, a first reference load of a first reference transistor is formed by a diode load.

In accordance with yet another preferred development of the present invention, a load of the matching transistor is formed as a load transistor connected as a diode load.

In accordance with yet another preferred development of the present invention, an input current provided by an input current source, a load current provided by a load current source and a reference current provided by a reference current source are matched to one another.

In accordance with yet another preferred development of the present invention, the load current source is held by the matching transistor at the same operating point as the input current source is held by the differential input stage and the reference current source is held by a reference stage comprising a first, a second and a third reference transistor.

Exemplary embodiments of the invention are illustrated in the drawings and are explained in more detail in the description below.

BRIEF DESCRIPTION OF THE FIGURES

In the figures.

In the figures, identical reference symbols designate identical or functionally identical components.

DETAILED DESCRIPTION

Figure 1:
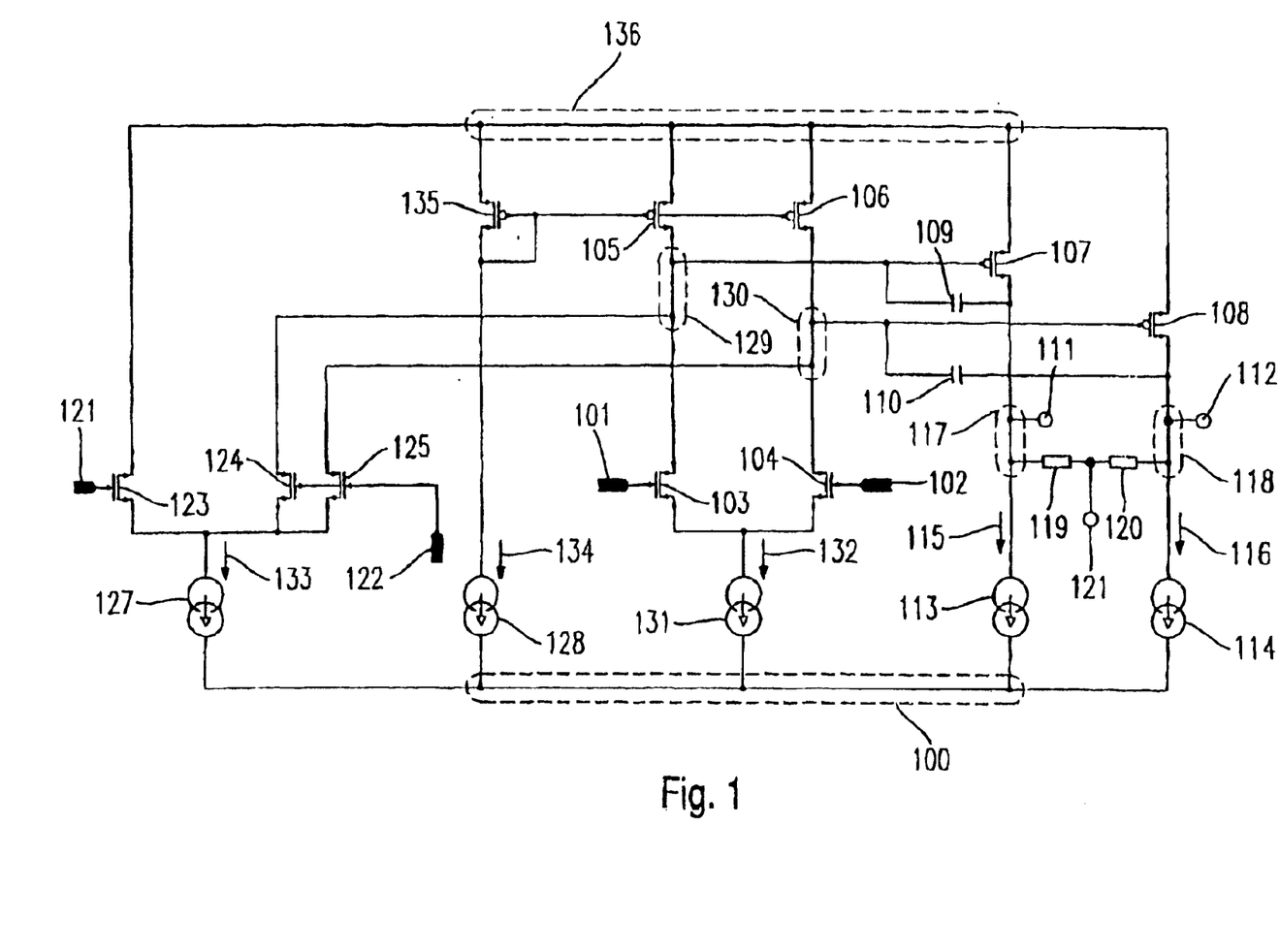
FIG. 1 shows a circuit arrangement for the amplification of an overall input signal, composed of a first input signal 101 and a second input signal 102, for forming an output signal, composed of a first output signal 111 and a second output signal 112, according to the present invention.

FIG. 1 shows a circuit arrangement for the amplification of an overall input signal, composed of a first input signal 101 and a second input signal 102, for forming an output signal, composed of a first output signal 111 and a second output signal 112, according to the present invention.

In the circuit arrangement shown in FIG. 1, a first input signal 101 is fed to a gate terminal of a first input transistor 103, while a second input signal 102 is fed to a gate terminal of a second input transistor 104. The source terminals of the two transistors 103 and 104 are interconnected and are connected to a first terminal of an input current source 131, whose second terminal is connected to a ground circuit node 100, the input current source 131 driving an input current 132.

The drain terminal of the first transistor 103 is connected to a first reference circuit node 129, while the drain terminal of the second transistor 104 is connected to a second reference circuit node 130. Furthermore, the gate terminal of a first output transistor 107 is connected to the first reference circuit node 129, while the gate terminal of a second output transistor 108 is connected to the second reference circuit node 130. A common-mode control is achieved by means of the two reference circuit nodes 129 and 130 in that the drain terminal of a second reference transistor 124 is connected to the first reference circuit node 129, while the drain terminal of a third reference transistor is connected to the second reference circuit node 130. The drain terminal of a first current mirror transistor 105 is likewise connected to the first reference circuit node 129, while the drain terminal of a second current mirror transistor 106 is connected to the second reference circuit node 130.

The gate terminal of the first current mirror transistor 105 is connected to the gate terminal of the second current mirror transistor 106 and the gate terminal of a load transistor 135, the gate and drain terminals of the load transistor 135 being interconnected in order thus to form a diode load. Furthermore, the drain terminal (and likewise the gate terminal) of the load transistor 135 is connected to a first terminal of a load current source 128, while a second terminal of the load current source 128 is connected to the ground circuit node 100. A load current 134 from the load current source 128 is driven in this way. The source terminals of the load transistor 135, of the first current mirror transistor 105, of the second current mirror transistor 106, of the first output transistor 107 and of the second output transistor 108 are connected to a supply circuit node 136, to which a supply voltage is applied. The gate terminals of the second and third reference transistors 124 and 125 are interconnected and connected to a reference voltage 122. The source terminals of a first reference transistor 123, whose drain terminal is connected to the supply circuit node 136, and of the second and third reference transistors 124 and 125 are interconnected and connected to a first terminal of a reference current source 127, whose second terminal is connected to the ground circuit node 100, whereby a reference current 133 is driven. In this way, the provision of a reference stage, which essentially comprises the first, second and third reference transistors 123, 124 and 125 and also the reference current source 127, makes it possible for a feedback signal 121 (the generation of the feedback signal will be described below) to be compared with the reference voltage 122 and to be controlled to the value thereof. The feedback signal 121 is obtained with the aid of a voltage divider, formed from a first feedback resistor 119 and a second feedback resistor 120, in the output circuit of the differential amplifier circuit arrangement. In this case, a first terminal of the first feedback resistor 119 is connected to a first output circuit node 117, while a first terminal of the second feedback resistor 120 is connected to a second output circuit node 118. The second terminal of the first feedback resistor 119 is connected to the second terminal of the second feedback resistor 120, it being possible to tap off a feedback signal 121 at the junction point between the two feedback resistors.

A first output signal 111 is provided at the first output circuit node 117, while a second output signal 112 is provided at the second output circuit node 118. The respective first and second output signals 111 and 112 form an overall output signal which corresponds to an input signal composed of the first and second input signals 101 and 102, respectively. The drain terminal of the first output transistor 107 is connected to the first output circuit node 117, which is in turn connected to a first terminal of a first output current source 113, the second terminal of the first output current source 113 being connected to the ground circuit node 100. The drain terminal of the second output transistor 108 is connected to the second output circuit node 118, which is in turn connected to a first terminal of a second output current source 114, a second terminal of the output current source 114 being connected to the ground circuit node 100. A first output current 115 from the first output current source 113 and a second output current 116 from the second output current source 114 are driven in this way.

A first compensation capacitance 109 is connected between the gate terminal and the drain terminal of the first output transistor 107, while a second compensation capacitance 110 is connected between the gate terminal and the drain terminal of the second output transistor 108.

Figure 2:
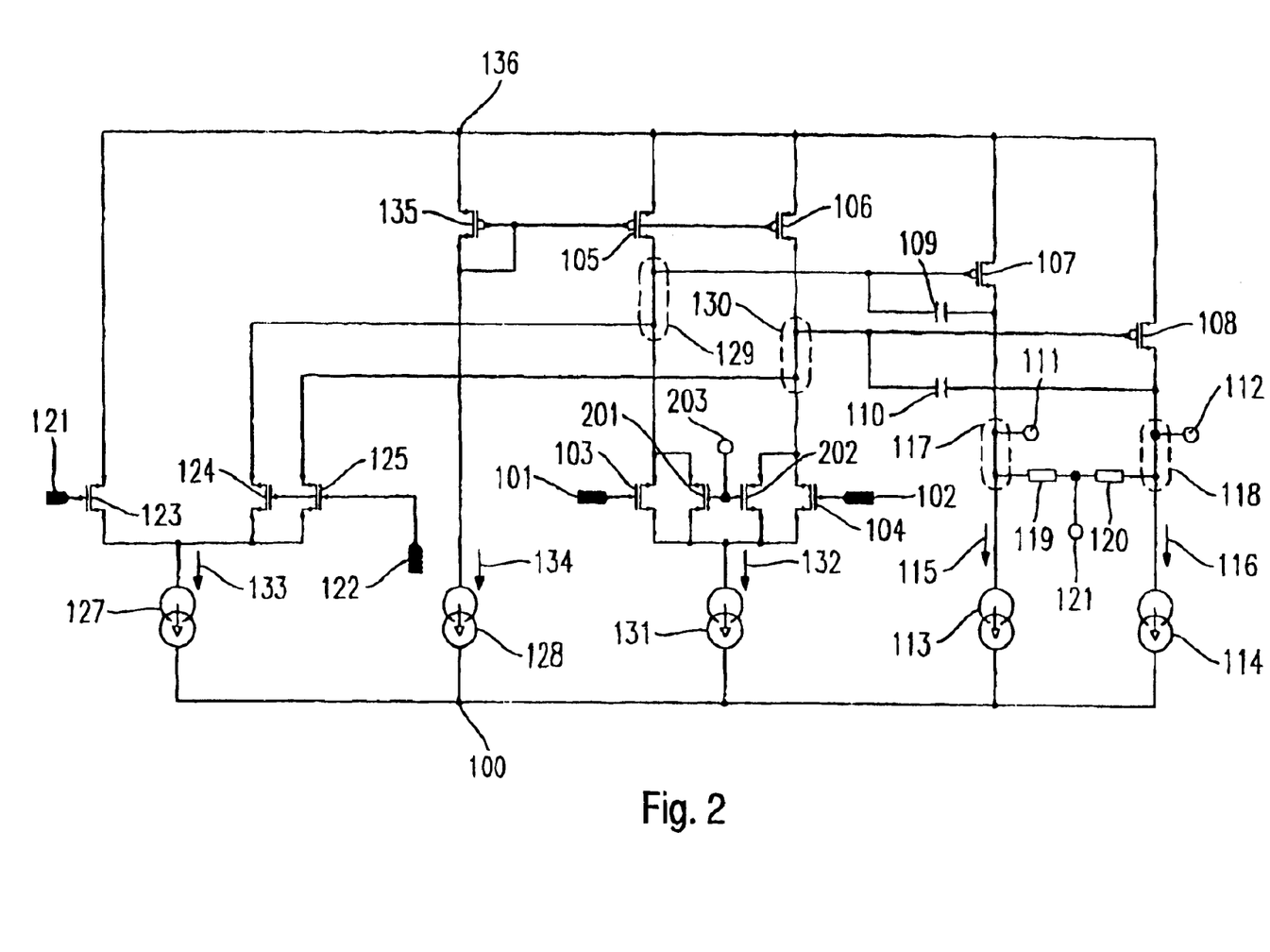
FIG. 2 shows an exemplary embodiment of a circuit arrangement according to the present invention, the circuit arrangement shown in FIG. 1 being extended by a start circuit unit comprising a first start transistor 201 and a second start transistor 202.

FIG. 2 illustrates an exemplary embodiment of a circuit arrangement according to the present invention, the circuit arrangement shown in FIG. 1 being extended by a start circuit unit comprising a first start transistor 201 and a second start transistor 202.

Two additional transistors, a first start transistor 201 and a second start transistor 202, are illustrated in the circuit arrangement shown in FIG. 2, the drain terminals of the first start transistor 201 and of the first input transistor 103 being interconnected and the source terminals of the first transistor 201 and of the first input transistor 103 being interconnected, while the drain terminals of the second start transistor 202 and of the second input transistor 104 and the source terminals of the second start transistor 202 and of the second input transistor 104 are interconnected. The two gate terminals of the two start transistors 201 and 202 are interconnected and connected to a reference partial voltage 203.

The start circuit unit comprising the two start transistors 201 and 202 which is additionally added in comparison with the circuit arrangement shown in FIG. 1 serves for running up (starting) the overall circuit arrangement to a desired operating point, since the entire circuit arrangement also has, besides the desired operating point, further undesirable stable operating points. If the first and second input signals 101 and 102 are at an excessively low potential, then the first input transistor 103 and the second input transistor 104 are in the off state. As a result, the first and second reference circuit nodes 129 and 130 assume a high potential, while the first and second output circuit nodes assume a low potential.

The common-mode control then attempts to pull the first and second reference circuit nodes 129 and 130 to a lower potential. Since the common-mode control only operates with a partial current, it cannot pull the first and second reference circuit nodes 129 and 130 to a lower potential.

What is achieved by the first start transistor 201 being connected in parallel with the first input transistor 103, and the second start transistor 202 being connected in parallel with the second input transistor 104 is that the first and second reference circuit nodes 129 and 130 are pulled to a lower potential in that a reference partial voltage 203, which is a specific magnitude less than the reference voltage 122, is applied to the two connected gate terminals of the first and second start transistors 201 and 202.

Figure 3:
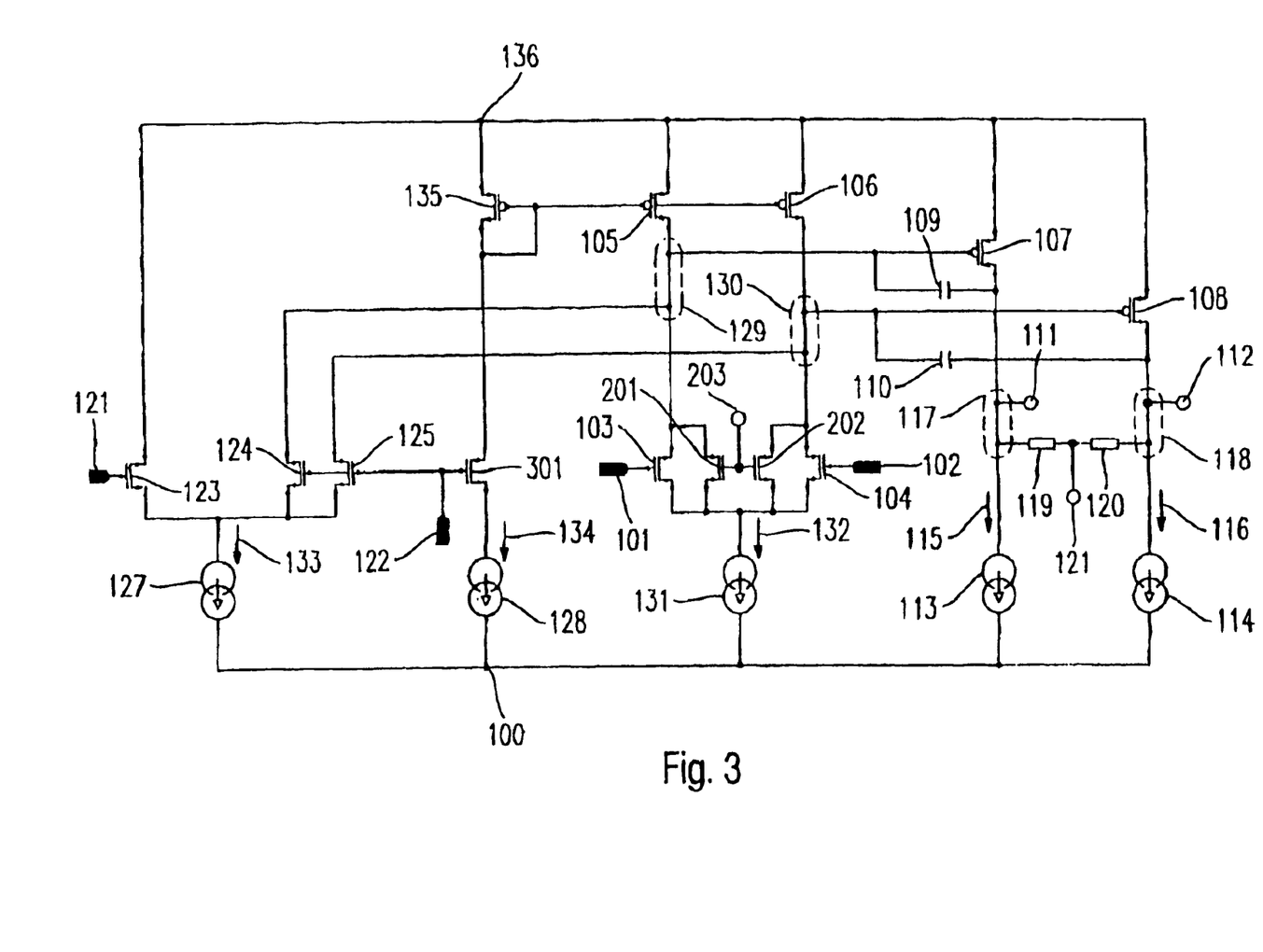
FIG. 3 shows an exemplary embodiment of a circuit arrangement according to the present invention, the circuit arrangement shown in FIG. 3 corresponding to the circuit arrangement shown in FIG. 2 except for provision of an additional matching transistor 301.

FIG. 3 illustrates an exemplary embodiment of a circuit arrangement according to the present invention, the circuit arrangement shown in FIG. 3 essentially corresponding to the circuit arrangement shown in FIG. 2, except that the drain terminal (and likewise the gate terminal) of the load transistor 135 is connected to the drain terminal of a matching transistor 301. The source terminal of the matching transistor 301 is connected to the first terminal of the load current source 128, while the gate terminal of the matching transistor 301 is connected to the reference voltage 122. In this way, the load current 134 from the load current source 128 is matched to the input current (132) of the input current source (131) and the reference current (133) of the reference current source (127).

Figure 4:
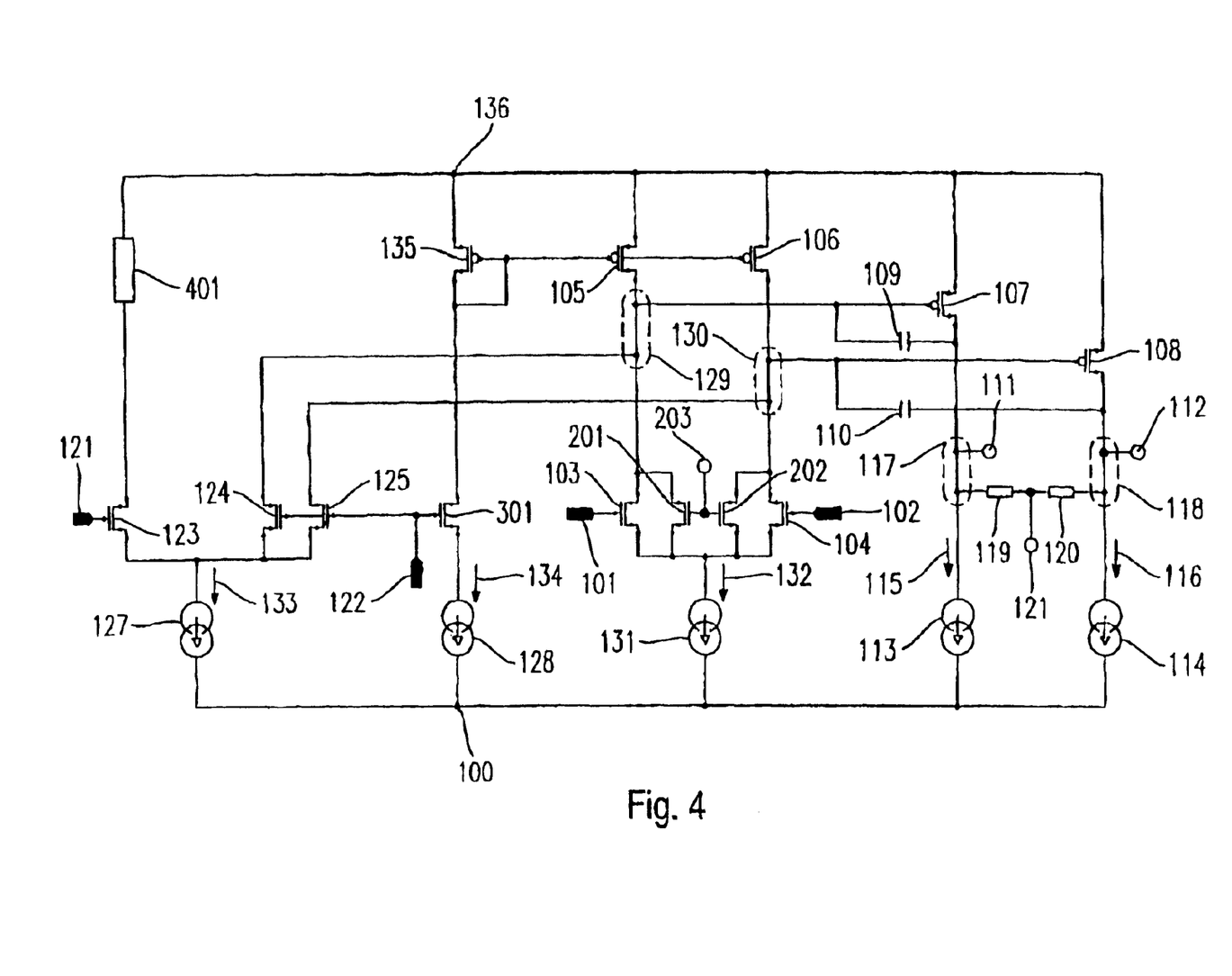
FIG. 4 shows an exemplary embodiment of a circuit arrangement according to the present invention, the circuit arrangement shown in FIG. 4 corresponding to the circuit arrangement shown in FIG. 3 except for provision of an additional first reference load 401 in a reference stage of FIG. 3.

FIG. 4 illustrates an exemplary embodiment of a circuit arrangement according to the present invention, the circuit arrangement shown in FIG. 4 essentially corresponding to the circuit arrangement shown in FIG. 3, except that a first reference load 401, formed from a resistor or from a diode load, is connected between the drain terminal of the first reference transistor 123 and the supply circuit node 136.

Although the present invention has been described above using preferred exemplary embodiments, it is not restricted thereto, but rather can be modified in diverse ways.

List of Reference Symbols

In the figures, identical reference symbols designate identical or functionally identical components.

100 Ground circuit node
101 First input signal
102 Second input signal
103 First input transistor
104 Second input transistor
105 First current mirror transistor
106 Second current mirror transistor
107 First output transistor
108 Second output transistor
109 First compensation capacitance
110 Second compensation capacitance
111 First output signal
112 Second output signal
113 First output current source
114 Second output current source
115 First output current
116 Second output current
117 First output circuit node
118 Second output circuit node
119 First feedback resistor
120 Second feedback resistor
121 Feedback signal
122 Reference voltage
123 First reference transistor
124 Second reference transistor
125 Third reference transistor
127 Reference current source
128 Load current source
129 First reference circuit node
130 Second reference circuit node
131 Input current source
132 Input current
133 Reference current
134 Load current
135 Load transistor
136 Supply circuit node
201 First start transistor
202 Second start transistor
203 Reference partial voltage
301 Matching transistor
401 First reference load
501 First reference load
502 Second reference load
503 First reference differential transistor
504 Second reference differential transistor

What is claimed is:

1. A circuit arrangement for amplifying an input signal, the circuit arrangement comprising:
   a differential input stage for receiving a differential input signal, the differential input stage having first and second input transistors;
   a differential output stage for providing a differential output signal, the differential output stage having first and second output transistors;
   a load current source for setting a load current;
   an input current source for setting an input current;
   a reference current source for setting a reference current;
   a reference stage for comparing a common-mode voltage of the circuit arrangement with a reference voltage; and
   a current mirror for mirroring the load current into the differential input stage.

2. The circuit arrangement of claim 1, wherein the differential input stage is configured to receive a differential input signal formed from first and second input signals.

3. The circuit arrangement of claim 1, further comprising:
   a first output circuit node for providing a first output signal; and
   a second output circuit node for providing a second output signal.

4. The circuit arrangement of claim 1, wherein the reference stage comprises first, second, and third reference transistors.

5. The circuit arrangement of claim 1, wherein the current mirror comprises first and second current mirror transistors.

6. The circuit arrangement of claim 1, further comprising a start circuit unit for starting the circuit arrangement, the start circuit unit having first and second start transistors.

7. The circuit arrangement of claim 1, further comprising a common mode control.

8. The circuit arrangement of claim 1, further comprising a common mode control for setting a partial current on the basis of a divisor factor that is less than one.

9. The circuit arrangement of claim 1, wherein the differential input stage comprises first and second start transistors.

10. The circuit arrangement of claim 4, wherein the second and third reference transistors have a transconductance less than the transconductance of the first and second input transistors.

11. The circuit arrangement of claim 1, further comprising a matching transistor having:
   a gate terminal to which a reference voltage is applied; and
   a drain-source path for transmitting the load current.

12. The circuit arrangement of claim 1, further comprising a resistor for forming a first reference load of a first reference transistor of the reference stage.

13. The circuit arrangement claim 1, further comprising a diode for forming a first reference load of a first reference transistor of the reference stage.

14. The circuit arrangement of claim 11, further comprising a load transistor connected as a load diode for providing a load to the matching transistor.

15. A method for amplifying an input signal, the method comprising:
   inputting a differential input signal into a differential input stage having first and second input transistors;
   outputting a differential output signal from a differential output stage having first and second output transistors;
   providing a matching transistor for matching a load-current source, an input-current source, and a reference-current source;
   controlling a common-mode voltage on the basis of a reference voltage; and
   mirroring a load current into the differential input stage.

16. The method of claim 15, wherein controlling a common-mode voltage comprises:
   controlling the common-mode voltage on the basis of a feedback signal provided by a voltage divider arranged between
   a first output circuit node, to which a first output signal is applied, and
   a second output signal node, to which a second output signal is applied.

17. The method of claim 16, further comprising comparing the feedback signal with a reference voltage.

18. The method of claim 15, wherein controlling a common-mode voltage comprises obtaining the common-mode voltage from the output stage.

19. The method of claim 15, further comprising operating a load transistor with a load current mirrored via first and second minor transistors into first and second input transistors of the differential input stage.

20. The method of claim 15, wherein controlling a common-mode voltage comprises controlling partial currents by means of first, second, and third reference transistors at respective first and second reference circuit nodes.

21. The method of claim 15, wherein controlling a common-mode voltage comprises avoiding an additional pole.

22. The method of claim 15, further comprising matching, to each other:
   a load current provided by the load-current source,
   a reference current provided by the reference-current source, and
   an input current provided by the input-current source.

23. The method of claim 15, further comprising:
   holding the load-current source at the same operating point as the input-current source; and
   holding the reference-current source.

24. The method of claim 15, further comprising:
   arranging a voltage divider between first and second output circuit nodes to which respective first and second output signals are applied; and
   determining the common-mode voltage.

25. The method of claim 16, further comprising comparing the feedback signal with the reference voltage.

* * * * *